United States Patent
Funakura et al.

[11] Patent Number: 5,959,463
[45] Date of Patent: Sep. 28, 1999

[54] SEMICONDUCTOR TEST APPARATUS FOR MEASURING POWER SUPPLY CURRENT OF SEMICONDUCTOR DEVICE

[75] Inventors: Teruhiko Funakura, Hyogo; Kazuya Fujita, Osaka, both of Japan

[73] Assignees: Mitsubishi Denki Kabushiki Kaisha, Tokyo; Yamada Den-On Co., Ltd., Osaka, both of Japan

[21] Appl. No.: 08/939,701

[22] Filed: Sep. 29, 1997

[30] Foreign Application Priority Data

Mar. 10, 1997 [JP] Japan ................................ 9-054804

[51] Int. Cl.⁶ .................................................. G01R 31/26
[52] U.S. Cl. ........................... 324/765; 324/763; 324/720
[58] Field of Search .................................. 324/763, 765, 324/720, 684; 438/14, 17; 714/733, 734

[56] References Cited

U.S. PATENT DOCUMENTS

| | | | |
|---|---|---|---|
| 5,519,335 | 5/1996 | Thomas | 324/765 |
| 5,583,820 | 12/1996 | Padoan et al. | 324/765 |
| 5,731,700 | 3/1998 | McDonald | 324/765 |
| 5,754,041 | 5/1998 | Kaito et al. | 324/765 |
| 5,773,990 | 6/1998 | Wilstrup et al. | 324/765 |

FOREIGN PATENT DOCUMENTS

| | | |
|---|---|---|
| 3-20682 | 1/1991 | Japan . |
| 5-107297 | 4/1993 | Japan . |

*Primary Examiner*—Diep Do
*Attorney, Agent, or Firm*—McDermott, Will & Emery

[57] ABSTRACT

A power supply voltage (Vcc) is applied to a dummy capacitor having a capacitance identical to that of a bypass capacitor to generate an excessive current. The excessive current is subtracted from a current flowing through an IC and the bypass capacitor to obtain a power supply current (Icc) of the IC. The time required for measuring power supply current (Icc) of the IC is reduced since it is not necessary to wait for attenuation of the excessive current of the bypass capacitor.

2 Claims, 4 Drawing Sheets

SEMICONDUCTOR TEST APPARATUS FOR MEASURING POWER SUPPLY CURRENT OF SEMICONDUCTOR DEVICE

BACKGROUND OF THE INVENTION

1. Field of the Invention

The present invention relates to semiconductor test apparatuses, and more particularly to a semiconductor test apparatus applying a power supply voltage to a semiconductor device having a capacitance between a power supply terminal and a ground terminal to measure a power supply current.

2. Description of the Background Art

FIG. 4 is a circuit block diagram showing a structure of a conventional semiconductor test apparatus.

Referring to FIG. 4, the semiconductor test apparatus has a bypass capacitor 50 (capacitance) connected between a power supply terminal 41 and a ground terminal 42 of a semiconductor integrated circuit device to be tested (referred to as IC hereinafter) 40. Bypass capacitor 50 is provided to remove noise and prevent oscillation. It is assumed that bypass capacitor 50 of FIG. 4 represents both an external capacitor connected to IC 40 for testing and an internal capacitor provided in advance in IC 40.

The semiconductor test apparatus includes a controller 30, a D/A converter 31, resistance elements 32, 33 and 35, operational amplifiers 34 and 36, and an A/D converter 37. Controller 30 is formed of a personal computer, for example, to provide control as follows. After a digital code is applied to D/A converter 31 and a power supply voltage Vcc is applied to IC 40, waiting is conducted for a power supply current Icc of IC 40 to be stabilized at an elapse of a predetermined time. Then, power supply current Icc of IC 40 is obtained according to a digital code from A/D converter 37.

D/A converter 31 converts a digital code from controller 30 into an analog voltage. Operational amplifier 34 and resistance elements 32 and 33 form an amplifier to amplify the analog voltage from D/A converter 31 to generate power supply voltage Vcc of IC 40. Resistance element 35 is provided to convert current I1 flowing to power supply terminal 41 of IC 40 from operational amplifier 34 into a voltage. More specifically, resistance element 32 is connected between an output terminal of D/A converter 31 and a non-inverting input terminal of operation amplifier 34. Resistance element 33 is connected between the non-inverting input terminal of operational amplifier 34 and power supply terminal 41 of IC 40. Resistance element 35 is connected between the output terminal of operational amplifier 34 and power supply terminal 41 of IC 40. The non-inverting input terminal of operational amplifier 34 and ground terminal 42 of IC 40 are connected to ground.

Operational amplifier 36 amplifies the voltage across the electrodes of resistance element 35, i.e., the voltage across power supply terminal 41 of IC 40 and the output terminal of operational amplifier 34. A/D converter 37 converts output voltage V1 of operational amplifier 36 into a digital code which is applied to controller 30.

The operation of this semiconductor test apparatus will be described hereinafter.

When an IC 40 is set at the semiconductor test apparatus, a digital code is applied from controller 30 to D/A converter 31, whereby power supply voltage Vcc is applied from operational amplifier 34 to power supply terminal 41 of IC 40 via resistance element 35. Current I1 flowing to IC 40 from operational amplifier 34 is converted into a voltage by resistance element 35. This voltage is amplified by operational amplifier 36. Output voltage V1 of operational amplifier 36 is converted into a digital code by A/D converter 37 to be provided to controller 30. According to this digital code, power supply current Icc of IC 40 is obtained by controller 30. Power supply current Icc of IC 40 is shown on a display screen 30a of controller 30.

In this conventional semiconductor test apparatus, application of power supply voltage Vcc to power supply terminal 41 of IC 40 causes an excessive current I2 to be conducted to bypass capacitor 50 to result in variation in current I1=Icc+I2. Therefore, there was an appreciable time after power supply voltage Vcc is applied and until excessive current I2 is attenuated to allow measurement of power supply current Icc of IC 40. The testing of IC 40 was time consuming to result in increase in the cost for testing, which in turn caused increase in the cost of IC 40.

SUMMARY OF THE INVENTION

In view of the foregoing, a main object of the present invention is to provide a semiconductor test apparatus that can measure in a short time a power supply current of a semiconductor device having a capacitance between a power supply terminal and a ground terminal.

According to an aspect of the present invention, a voltage of a level identical to the level of a power supply voltage of a semiconductor device is applied to a dummy capacitor having a capacitance identical to the capacitance between a power supply terminal and a ground terminal of the semiconductor device to generate an excessive current I3. By subtracting excessive current I3 of the dummy capacitor from current I1 flowing through the semiconductor device, the power supply current of the semiconductor device, Icc=I1-I3, is obtained. Since it is not necessary to wait for attenuation of current I2=I3 flowing to the capacitance of a semiconductor device as in a conventional case, power supply current Icc of the semiconductor device can be measured in a short time.

Preferably, the semiconductor test apparatus further includes a determination circuit for determining whether the measured power supply current Icc is within a predetermined range. In this case, determination can be made easily and reliably of whether the semiconductor device is an acceptable product or not.

The foregoing and other objects, features, aspects and advantages of the present invention will become more apparent from the following detailed description of the present invention, when taken in conjunction with the accompanying drawings.

DESCRIPTION OF THE PREFERRED EMBODIMENTS

Figure 1:
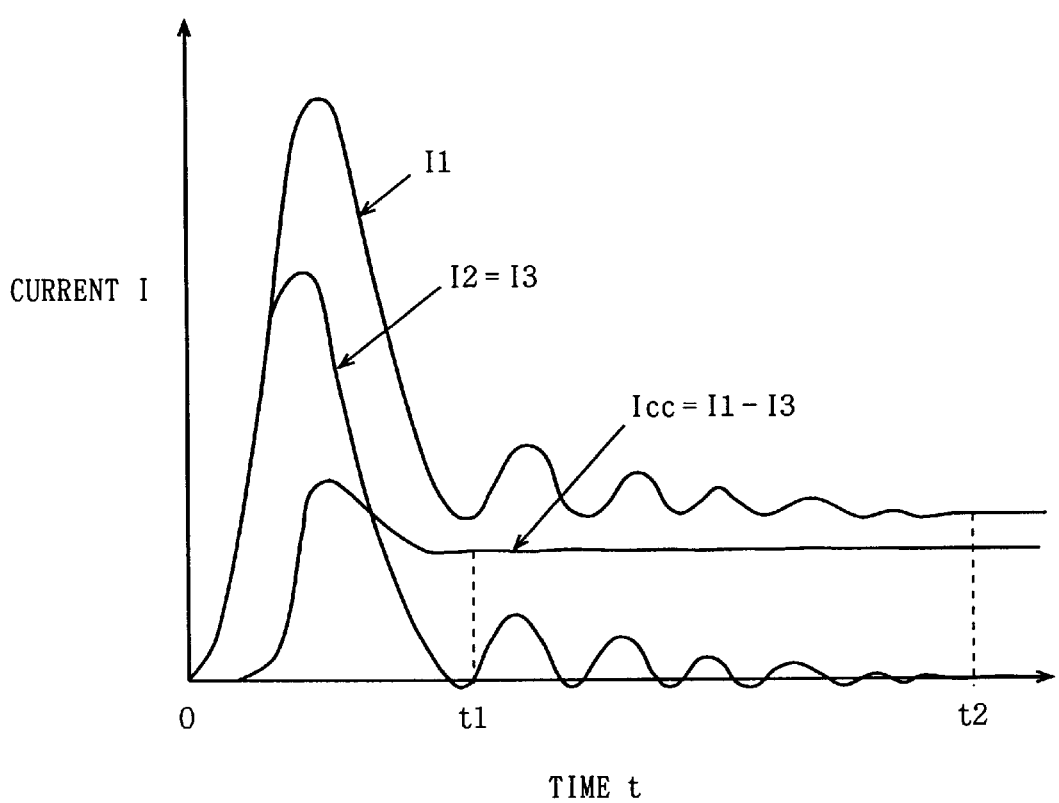
FIG. 1 is a waveform diagram for describing the principle of a semiconductor test apparatus according to the present invention.

The principle of the present invention will first be described prior to the description of the embodiments of the present invention. When a power supply voltage Vcc is applied to IC 40 including bypass capacitor 50, a power supply current Icc flows from operational amplifier 34 to IC 40 per se, as shown in FIG. 1. At the same time, an excessive current I2 flows from operational amplifier 34 to bypass capacitor 50. A time period t2 is required for stabilization of excessive current I2. In contrast, a shorter time period t1 is required for power supply current I1 per se to be stabilized.

Therefore, by additionally generating a current I3 identical to excessive current I2 of bypass capacitor 50 and subtracting this current I3 from the total current I1 flowing from operational amplifier 34 to IC 40, power supply current Icc can be achieved. Power supply current Icc can be measured in a short time. Current I3 is generated by providing additionally a dummy capacitor 1 that is identical in type and in capacitance to bypass capacitor 50, and apply power supply voltage Vcc simultaneously to capacitors 50 and 1. The excessive current of dummy capacitor 1 becomes current I3. The present invention will be described in detail hereinafter with reference to the drawings.

First Embodiment

Figure 2:
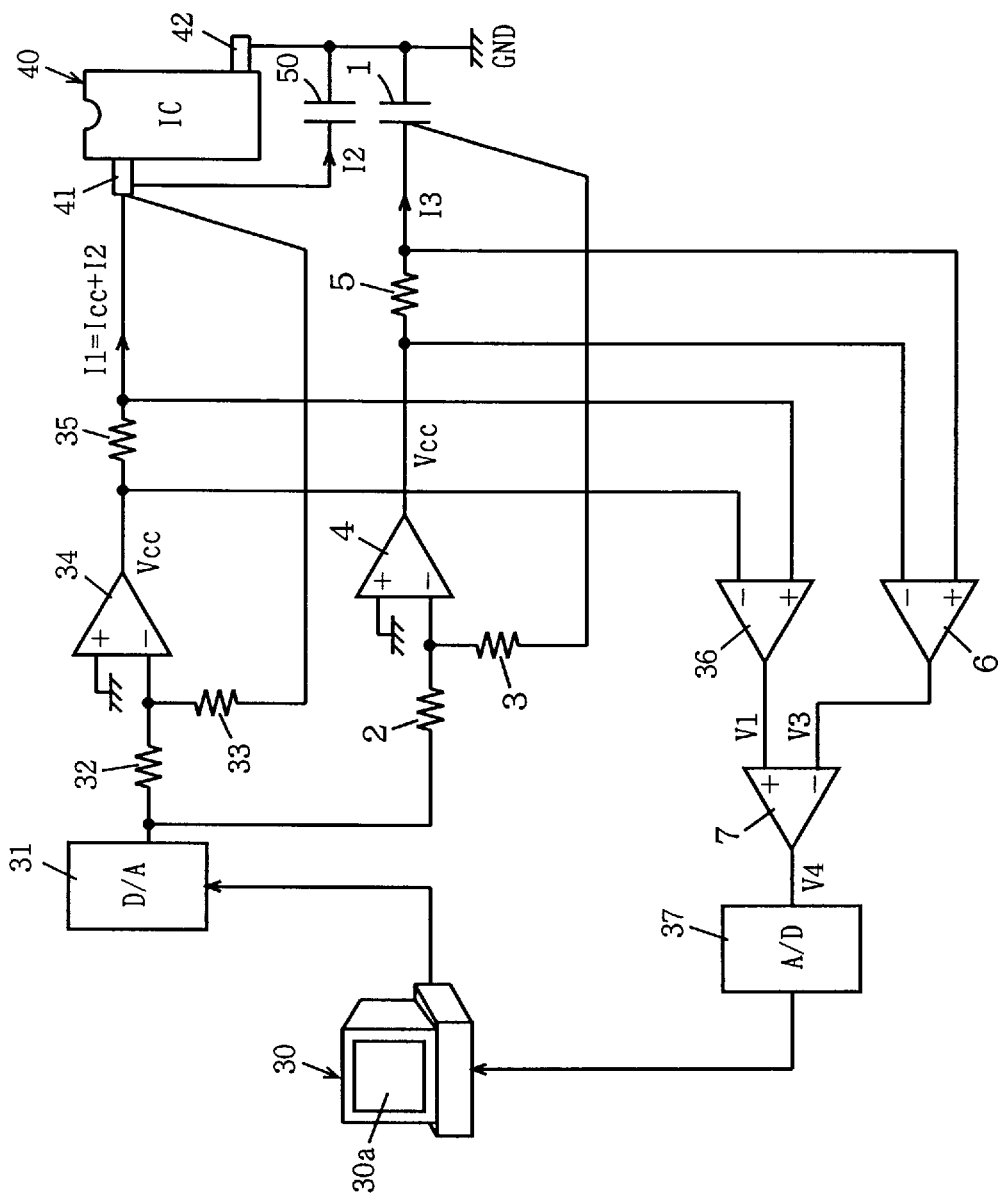
FIG. 2 is a circuit block diagram showing a structure of a semiconductor test apparatus according to a first embodiment of the present invention.

FIG. 2 is a block diagram showing a structure of a semiconductor test apparatus according to a first embodiment of the present invention.

Referring to FIG. 2, the semiconductor test apparatus of the present embodiment differs from the conventional semiconductor test apparatus in that a dummy capacitor 1, resistance elements 2, 3 and 5, and operational amplifiers 4, 6 and 7 are newly provided. Dummy capacitor 1 is a capacitor identical in type and in capacitance to bypass capacitor 50. Resistance elements 2, 3, and 5 have a resistance value identical to that of resistance elements 32, 33, and 35. Operational amplifier 6 has characteristics identical to those of operational amplifier 36.

Operational amplifier 4 and resistance elements 2 and 4 form an amplifier to amplify the output voltage of D/A capacitor 31. A voltage identical in level to power supply voltage Vcc of IC 40 is generated. This generated voltage is applied across the electrodes of dummy capacitor 1. Resistance element 5 is provided to convert current I3 flowing to one electrode of dummy capacitor 1 from operational amplifier 4 into a voltage. More specifically, resistance element 2 is connected between an output terminal of D/A converter 31 and a non-inverting input terminal of operational amplifier 4. Resistance element 3 is connected between the non-inverting input terminal of operational amplifier 4 and one electrode of dummy capacitor 1. Resistance element 5 is connected between an output terminal of operational amplifier 4 and the one electrode of dummy capacitor 1. The non-inverting input terminal of operational amplifier 4 and the other electrode of dummy capacitor 1 are both connected to ground.

Operational amplifier 6 amplifies the voltage across the electrodes of resistance element 5, i.e., the voltage across the one electrode of dummy capacitor 1 and the output terminal of operational amplifier 4. Operational amplifier 7 generates a voltage V4 which is the difference between the output voltage V1 of operational amplifier 36 and the output voltage V2 of operational amplifier 6. The generated voltage V4=V1−V3 is applied to A/D converter 37. The remaining structure is identical to that of the conventional semiconductor test apparatus. Therefore, description thereof will not be repeated.

The operation of the semiconductor test apparatus of the first embodiment will be described hereinafter.

When IC 40 is set at the semiconductor test apparatus, a digital code is applied from controller 30 to D/A converter 31. Power supply voltage Vcc is applied to power supply terminal 41 of IC 40 from operational amplifier 34 via resistance element 35. Also, a voltage of a level identical to the level of power supply voltage Vcc of IC 40 is applied to one electrode of dummy capacitor 1 from operational amplifier 4 via resistance element 5. Since bypass capacitor 50 is identical to dummy capacitor 1, and the same voltage Vcc is applied simultaneously, excessive current I2 of bypass capacitor 50 is completely identical to excessive current I3 of dummy capacitor 1.

Current I1 flowing from operational amplifier 34 to IC 40 is converted into a voltage by resistance element 35. This voltage is amplified by operational amplifier 36. Current IC flowing from operational amplifier 40 to dummy capacitor 1 is converted into a voltage by resistance element 5. This voltage is amplified by operational amplifier 6. A voltage V4 which is the difference between output voltage V1 of operational amplifier 36 and output voltage V3 of operational amplifier 6 (V4=V1−V3) is generated at operational amplifier 7.

Since output voltages V1 and V3 of operational amplifiers 36 and 6 are proportional to the values of currents I1 and I3, respectively, voltage V4=V1−V3 is proportional to current I1−I3=Icc which is the difference between currents I1 and I3. Therefore, voltage V4 is stabilized in a shorter time period than voltages V1 and V3 as described with reference to FIG. 1.

Output voltage V4 of operational amplifier 7 is converted into a digital code by A/D converter 37. This digital code is applied to controller 30 to be converted into power supply current Icc of IC 40. Power supply current Icc is indicated on display screen 30a of controller 30.

According to the present embodiment, it is not necessary to wait for excessive current I2 of bypass capacitor 50 to attenuate since power supply current Icc of IC 40 is obtained by subtracting excessive current I3 of dummy capacitor 1, i.e. excessive current I2 of bypass capacitor 50, from current I1=Icc+I2 flowing to IC 40 and bypass capacitor 50. The time required for measuring can be reduced in comparison to the conventional case where power supply current Icc of IC 40 was measured after attenuation of excessive current I2. This provides the advantage that the cost for testing can be reduced, which in turn reduces the cost of IC 40.

Furthermore, the measurement accuracy can be improved since the noise of the ground potential GND line generated in association with the operation of IC 40 is subtracted similar to the excessive current of capacitors 50 and 1.

Second Embodiment

Figure 3:
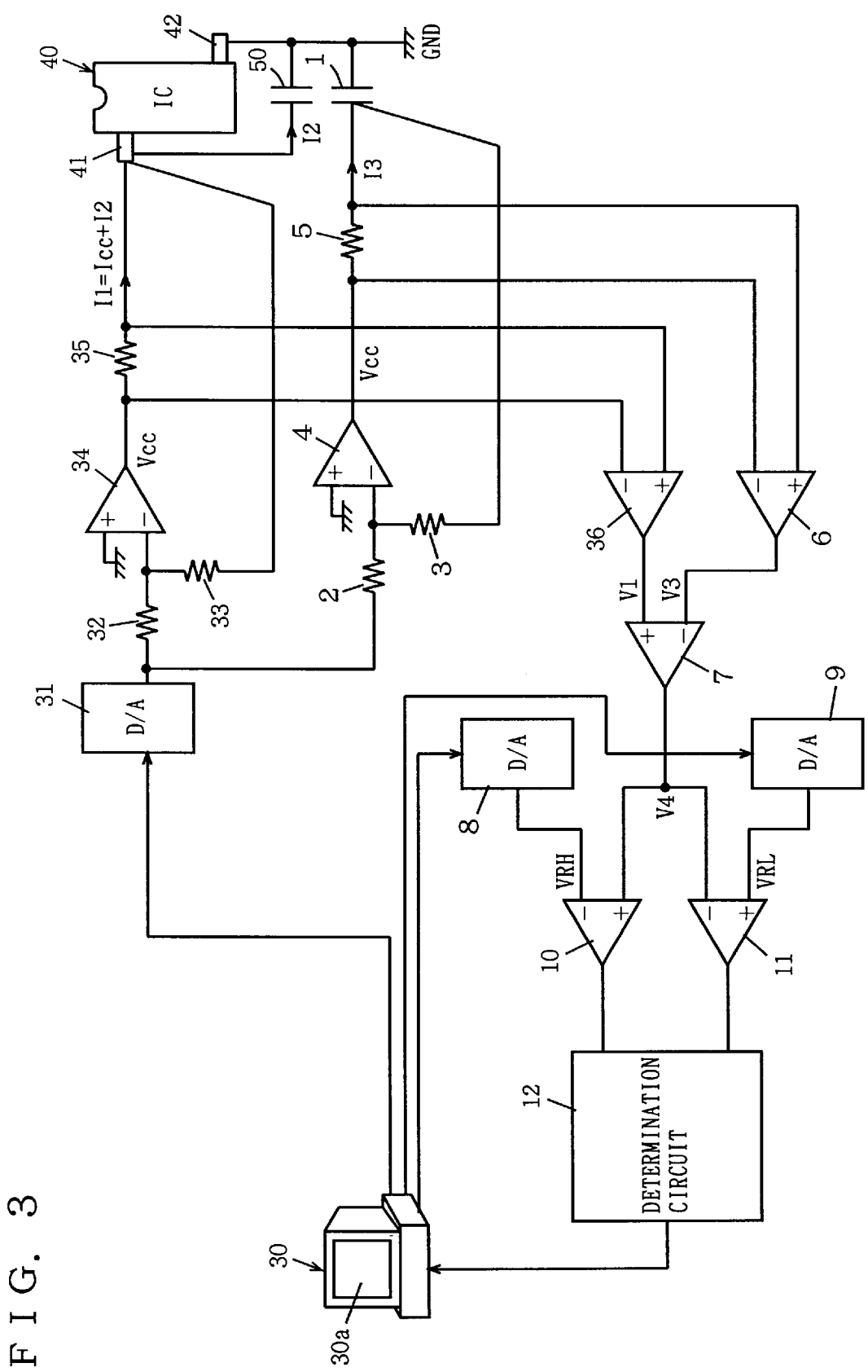
FIG. 3 is a circuit block diagram showing a structure of a semiconductor test apparatus according to a second embodiment of the present invention.
Figure 4:
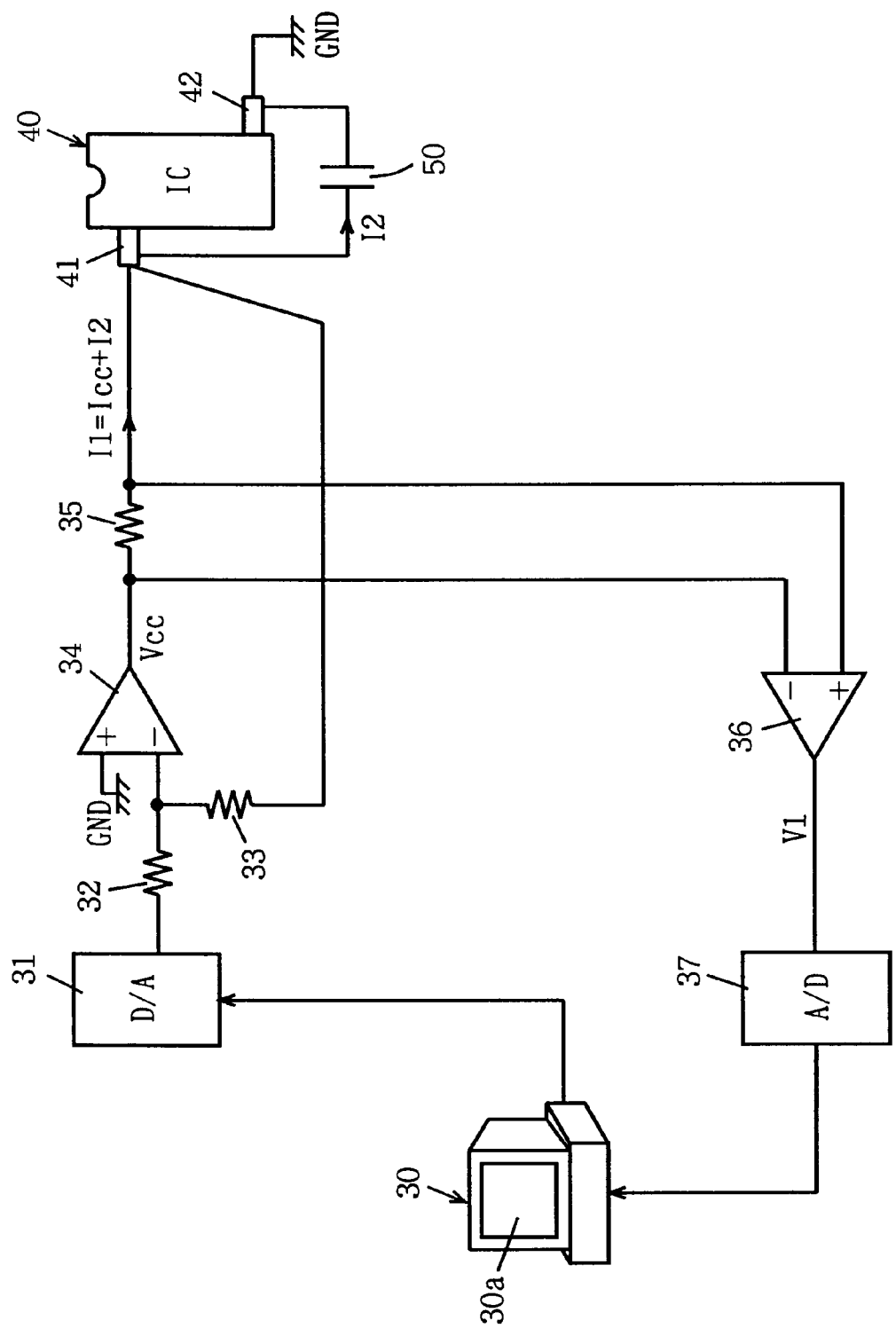
FIG. 4 is a circuit block diagram showing a structure of a conventional semiconductor test apparatus.

FIG. 3 is a circuit block diagram showing a structure of a semiconductor test apparatus according to a second embodiment of the present invention.

Referring to FIG. 3, the semiconductor test apparatus of the second embodiment differs from the semiconductor test apparatus of the first embodiment in that A/D converter 37 is removed, and D/A converters 8 and 9, comparators 10 and 11 and a determination circuit 12 are newly provided.

D/A converter 8 converts the digital code from controller 30 into an analog reference voltage VRH. This converted voltage is provided to comparator 10. Reference voltage VRH is a conversion of the upper limit of a normal range of power supply current Icc of IC 40 into an output voltage of operational amplifier 7. D/A converter 9 converts the digital code from controller 30 into an analog reference voltage VRL. This analog reference voltage VRL is provided to comparator 11. Reference voltage VRL is a conversion of the lower limit of the normal range of power supply current Icc of IC 40 into an output voltage of operational amplifier 7.

Comparator 10 compares output voltage V4 of operational amplifier 7 with reference voltage VRH. When output voltage V4 of operational amplifier 7 becomes higher than reference voltage VRH, a signal of an H level (logical high) is provided to determination circuit 12. Comparator 11 compares output voltage V4 of operational amplifier 7 with reference voltage VRL. When output voltage V4 of operational amplifier 7 becomes lower than reference voltage VRL, a signal of an H level is provided to determination circuit 12.

Determination circuit 12 responds an input H level signal from comparator 10 or 11 to provide a signal indicating that IC 40 is faulty to controller 30. The remaining structure is identical to that of the semiconductor test apparatus of the first embodiment. Therefore, description thereof will not be repeated.

The operation of the semiconductor test apparatus of the second embodiment will be described hereinafter.

When IC 40 is set at the semiconductor test apparatus, a digital code is provided from controller 30 to D/A converter 31. The same voltage Vcc is applied from operational amplifiers 34 and 4 simultaneously to IC 40 and dummy capacitor 1. Output currents I1 and I3 of operational amplifiers 34 and 4 are converted into voltages V1 and V3, respectively, by resistance elements 35 and 5 and operational amplifiers 36 and 6. A voltage V4 which is the difference between the two voltages (V4=V1−V3) is output from operational amplifier 7. When output voltage V4 of operational amplifier 7 is not within the range of power supply voltage VRL~VRH, comparator 10 or 11 provides an output of an H level, whereby determination circuit 12 provides the determination that IC 40 is a faulty product. The determination result of determination circuit 12 is provided on display screen 30a of controller 30.

In addition to the effects of the first embodiment, the second embodiment provides the advantage that determination of whether IC 40 is an acceptable product or not is given easily and rapidly by virtue of provision of determination circuit 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor test apparatus for measuring a power supply current by applying a power supply voltage to a semiconductor device having a capacitance between a power supply terminal and a ground terminal, said semiconductor test apparatus comprising:

a dummy capacitor having a capacitance identical to said capacitance of said semiconductor device, a first power supply for applying said power supply voltage across said power supply terminal of said semiconductor device, a second power supply for applying a voltage identical to an output voltage of said first power supply across electrodes of said dummy capacitor simultaneous with said first power supply, first current measure means for measuring a current flowing from said first power supply to said semiconductor device, second current measure means for measuring a current flowing from said second power supply to said dummy capacitor, and operation means for obtaining a power supply current of said semiconductor device by subtracting a measured value of said second current measure means from a measured value of said first current measure means.

2. The semiconductor test apparatus according to claim 1, further comprising:

determination means for determining whether a power supply current of said semiconductor device obtained by said operation means is within a predetermined range.

* * * * *